United States Patent
Yu et al.

(10) Patent No.: US 12,413,190 B2
(45) Date of Patent: Sep. 9, 2025

(54) POWER AMPLIFIER SUPPLY NETWORKS WITH HARMONIC TERMINATIONS

(71) Applicant: Skyworks Solutions, Inc., Irvine, CA (US)

(72) Inventors: Bo Yu, San Diego, CA (US); Hyeong Tae Jeong, Westlake Village, CA (US); Bo Pan, Irvine, CA (US); Phi Nguyen Dang, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 644 days.

(21) Appl. No.: 17/814,658

(22) Filed: Jul. 25, 2022

(65) Prior Publication Data

US 2023/0046261 A1  Feb. 16, 2023

Related U.S. Application Data

(60) Provisional application No. 63/260,294, filed on Aug. 16, 2021.

(51) Int. Cl.
*H03F 1/30* (2006.01)
*H03F 1/02* (2006.01)
(Continued)

(52) U.S. Cl.
CPC ........... *H03F 3/245* (2013.01); *H03F 1/0222* (2013.01); *H03F 1/565* (2013.01); *H03F 3/195* (2013.01);
(Continued)

(58) Field of Classification Search
CPC .................................... H03F 1/30; H03F 1/02
(Continued)

(56) References Cited

U.S. PATENT DOCUMENTS

| | | |
|---|---|---|
| 5,264,752 A | 11/1993 | Savicki |
| 6,157,253 A | 12/2000 | Sigmon et al. |

(Continued)

FOREIGN PATENT DOCUMENTS

| | | |
|---|---|---|
| GB | 2398648 | 8/2004 |
| GB | 2409115 | 11/2006 |

(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

(Continued)

*Primary Examiner* — Henry Choe
(74) *Attorney, Agent, or Firm* — Knobbe, Martens, Olson & Bear, LLP

(57) ABSTRACT

Power amplifier supply networks with harmonic terminations are disclosed. In certain embodiments, a power amplifier system includes a first power amplifier that amplifies a first radio frequency (RF) signal of a first fundamental frequency, a second power amplifier that amplifies a second RF signal of a second fundamental frequency, and a power amplifier supply network that distributes a power amplifier supply voltage to the first power amplifier at a first distribution node and to the second power amplifier at a second distribution node. The power amplifier supply network includes a first harmonic termination circuit connected to the first distribution node that provide an open circuit at about twice the first fundamental frequency, and a second harmonic termination circuit connected to the second distribution node and that provides an open circuit at about twice the fundamental frequency.

20 Claims, 14 Drawing Sheets

(51) Int. Cl.
  *H03F 1/56* (2006.01)
  *H03F 3/195* (2006.01)
  *H03F 3/24* (2006.01)
(52) U.S. Cl.
  CPC .. *H03F 2200/451* (2013.01); *H03F 2200/504* (2013.01)
(58) Field of Classification Search
  USPC ..................................... 330/297, 124 R, 295
  See application file for complete search history.

(56) References Cited

U.S. PATENT DOCUMENTS

| | | |
|---|---|---|
| 6,639,462 B1 | 10/2003 | Luu |
| 7,348,842 B2 | 3/2008 | Ichitsubo et al. |
| 7,482,869 B2 | 1/2009 | Wilson |
| 7,515,879 B2 | 4/2009 | Okabe et al. |
| 7,679,451 B2 | 3/2010 | Chen et al. |
| 7,880,548 B2 | 2/2011 | Ye |
| 8,344,806 B1 | 1/2013 | Franck et al. |
| 8,797,103 B2 | 8/2014 | Kaczman et al. |
| 9,088,249 B2 | 7/2015 | Kaczman et al. |
| 2002/0030543 A1 | 3/2002 | French et al. |
| 2003/0155978 A1 | 8/2003 | Pehlke |
| 2007/0210771 A1 | 9/2007 | Wilson et al. |
| 2007/0249304 A1 | 10/2007 | Snelgrove et al. |
| 2007/0273449 A1 | 11/2007 | Wilson |
| 2007/0279019 A1 | 12/2007 | Wilson |
| 2009/0128236 A1 | 5/2009 | Wilson |
| 2009/0289720 A1 | 11/2009 | Takinami |
| 2009/0302941 A1 | 12/2009 | Wimpenny |
| 2010/0045385 A1 | 2/2010 | Pengelly |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A Mash Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

International Search Report and Written Opinion of Jul. 30, 2012 for International Application No. PCT/US2011/063821. 7 pages.

Tateoka et al., "A GaAs MCM Power Amplifier of 3.6V Operation with High Efficiency of 49% for 0.9GHz Digital Cellular Phone Systems," IEEE Trans. on Microw. Theory Tech., vol. 43, No. 11, Nov. 1995, pp. 2539-2542.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

POWER AMPLIFIER SUPPLY NETWORKS WITH HARMONIC TERMINATIONS

CROSS-REFERENCE TO RELATED APPLICATIONS

This application claims the benefit of priority under 35 U.S.C. § 119 of U.S. Provisional Patent Application No. 63/260,294, filed Aug. 16, 2021 and titled "POWER AMPLIFIER SUPPLY NETWORKS WITH HARMONIC TERMINATIONS," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a first radio frequency signal of a first fundamental frequency and a second radio frequency signal of a second fundamental frequency. The mobile device further includes a front-end system including a first power amplifier configured to amplify the first radio frequency signal and a second power amplifier configured to amplify the second radio frequency signal, and a power amplifier supply network configured to receive a power amplifier supply voltage at an input node, and to provide the power amplifier supply voltage to the first power amplifier at a first distribution node and to the second power amplifier at a second distribution node. the power amplifier supply network includes a first harmonic termination circuit connected to the first distribution node and configured to provide an open circuit at about twice the first fundamental frequency, and a second harmonic termination circuit connected to the second distribution node and configured to provide an open circuit at about twice the second fundamental frequency.

In some embodiments, the first harmonic termination circuit is further configured to provide a short circuit at about the first fundamental frequency, and the second harmonic termination circuit is further configured to provide a short circuit at about the second fundamental frequency. According to a number of embodiments, the first harmonic termination circuit is further configured to provide a low impedance at about three times the first fundamental frequency, and the second harmonic termination circuit is further configured to provide a low impedance at about three times the second fundamental frequency. In accordance with several embodiments, the first harmonic termination circuit includes a first capacitor connected between the first distribution node and a ground voltage, and a first tank circuit in parallel with the first capacitor and including a first tank inductor in series with a first tank capacitor.

In various embodiments, the first fundamental frequency is in a high band and the second fundamental frequency is in a mid band.

In some embodiments, the power amplifier supply network further includes a first isolation inductor connected between the input node and the first distribution node, and a second isolation inductor connected between the input node and the second distribution node. According to a number of embodiments, the power amplifier supply network further includes a common mode capacitor connected between the input node and a ground voltage.

In several embodiments, the first power amplifier includes an output balun, and the first distribution node is connected to a center tap of a first winding of the output balun.

In various embodiments, the mobile phone further includes a power management unit configured to generate the power amplifier supply voltage.

In some embodiments, the front end system further includes a third power amplifier configured to amplify a third radio frequency signal and to receive the power amplifier supply voltage from a third distribution node of the power amplifier supply network, the power amplifier supply network further including a third harmonic termination circuit connected to the third distribution node and configured to provide an open circuit at about twice a third fundamental frequency of the third radio frequency signal.

In certain embodiments, the present disclosure relates to a power amplifier system. The power amplifier system further includes a first power amplifier configured to amplify a first radio frequency signal of a first fundamental frequency, a second power amplifier configured to amplify a second radio frequency signal of a second fundamental frequency, and a power amplifier supply network configured to receive a power amplifier supply voltage at an input node, and to provide the power amplifier supply voltage to the first power amplifier at a first distribution node and to the second power amplifier at a second distribution node. The power amplifier supply network includes a first harmonic termination circuit connected to the first distribution node and configured to provide an open circuit at about twice the first fundamental frequency, and a second harmonic termination circuit connected to the second distribution node and configured to provide an open circuit at about twice the second fundamental frequency.

In some embodiments, the first harmonic termination circuit is further configured to provide a short circuit at about the first fundamental frequency, and the second harmonic termination circuit is further configured to provide a short circuit at about the second fundamental frequency. According to a number of embodiments, the first harmonic termination circuit is further configured to provide a low impedance at about three times the first fundamental frequency, and the second harmonic termination circuit is further configured to provide a low impedance at about three times the second fundamental frequency. In accordance with various embodiments, the first harmonic termination circuit includes a first capacitor connected between the first distribution node and a ground voltage, and a first tank circuit in parallel with the first capacitor and including a first tank inductor in series with a first tank capacitor.

In several embodiments, the first fundamental frequency is in a high band and the second fundamental frequency is in a mid band.

In some embodiments, the power amplifier supply network further includes a first isolation inductor connected between the input node and the first distribution node, and a second isolation inductor connected between the input node and the second distribution node. According to a number of embodiments, the power amplifier supply network further includes a common mode capacitor connected between the input node and a ground voltage.

In various embodiments, the first power amplifier includes an output balun, and the first distribution node is connected to a center tap of a first winding of the output balun.

In several embodiments, the power amplifier system further includes a third power amplifier configured to amplify a third radio frequency signal and to receive the power amplifier supply voltage from a third distribution node of the power amplifier supply network, the power amplifier supply network further including a third harmonic termination circuit connected to the third distribution node and configured to provide an open circuit at about twice a third fundamental frequency of the third radio frequency signal.

In certain embodiments, the present disclosure relates to a method of power supply distribution in a mobile device. The method includes amplifying a first radio frequency signal of a first fundamental frequency using a first power amplifier, amplifying a second radio frequency signal of a second fundamental frequency using a second power amplifier, distributing a power amplifier supply voltage received at an input node of a power amplifier supply network to the first power amplifier at a first distribution node and to the second power amplifier at a second distribution node, providing an open circuit at about twice the first fundamental frequency using a first harmonic termination circuit connected to the first distribution node, and providing an open circuit at about twice the second fundamental frequency using a second harmonic termination circuit connected to the second distribution node.

DETAILED DESCRIPTION OF EMBODIMENTS

Figure 1:
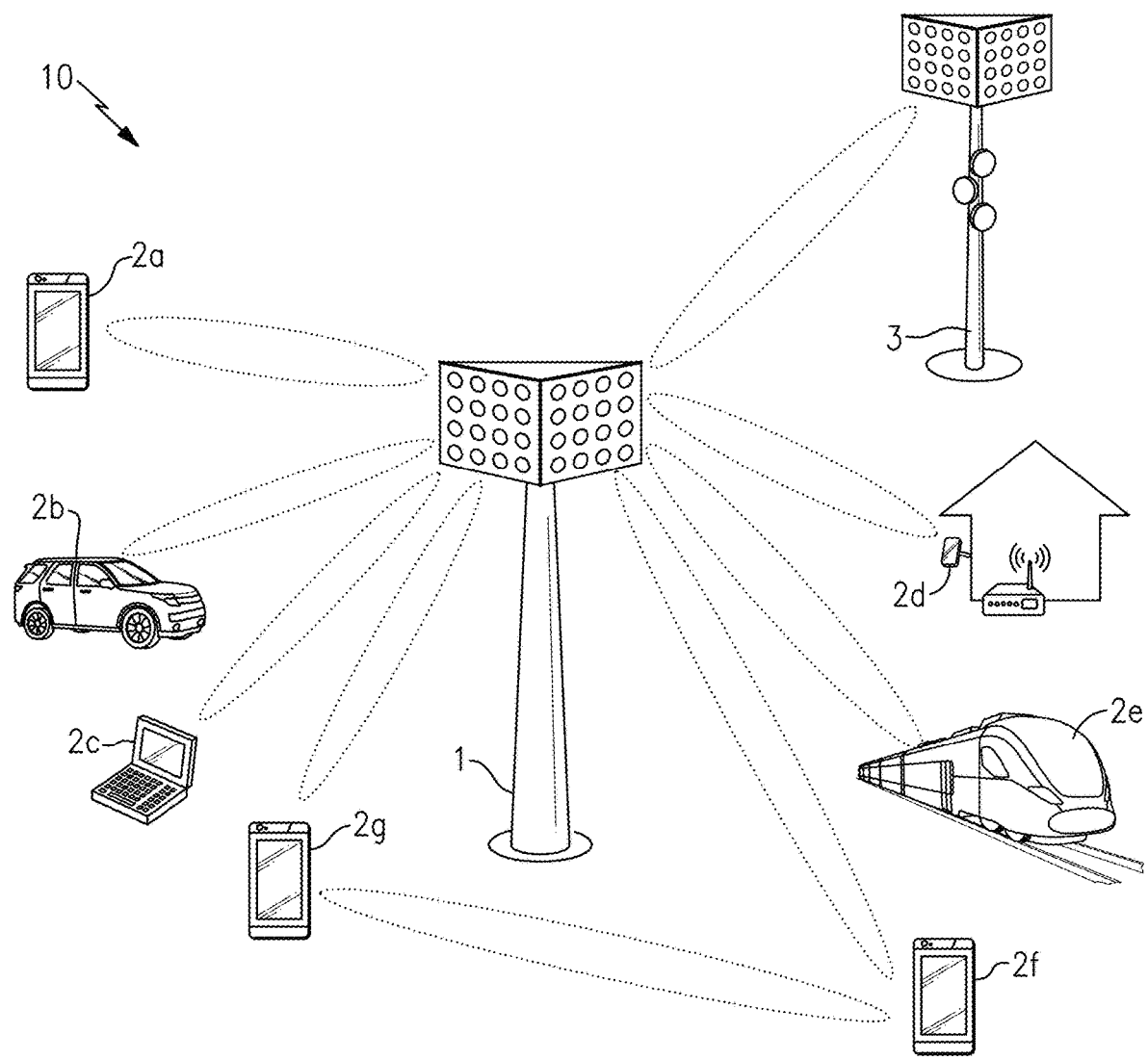
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
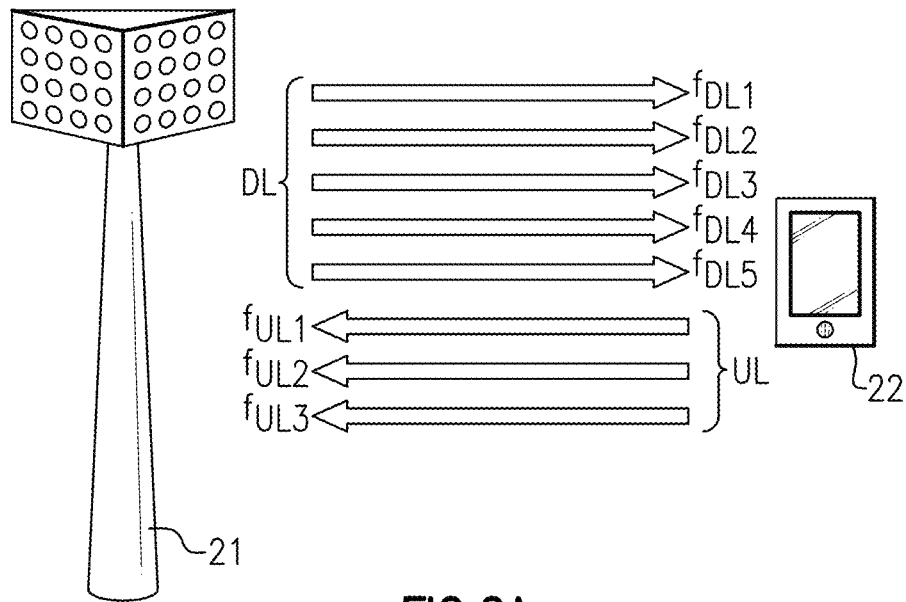
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
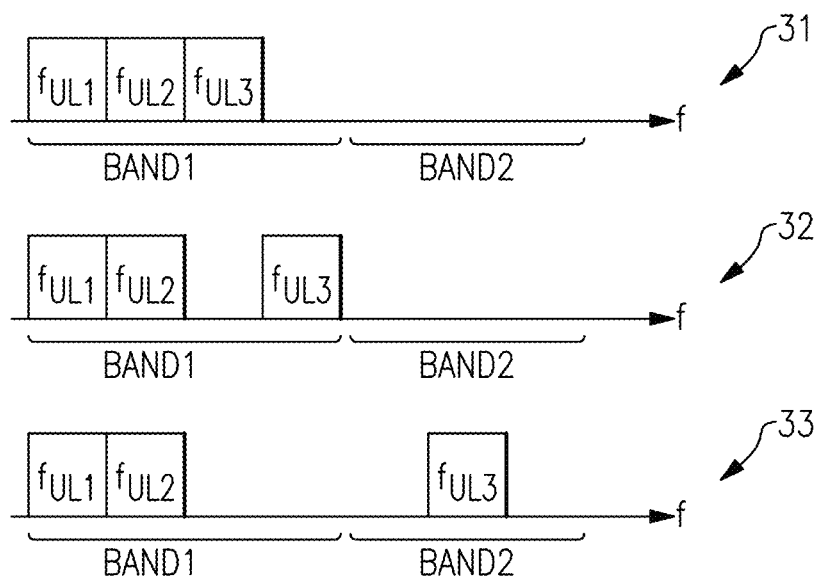
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $F_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
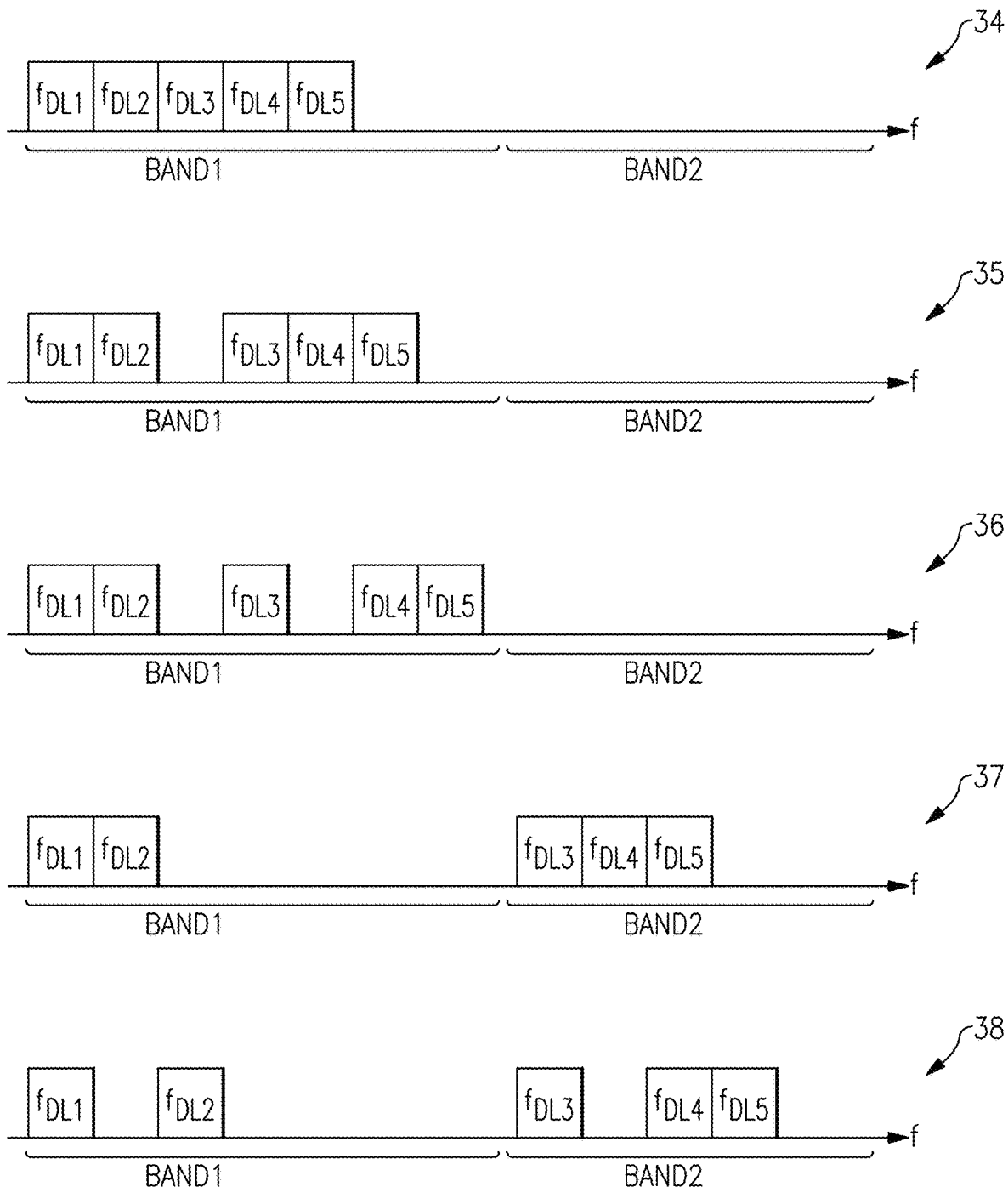
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
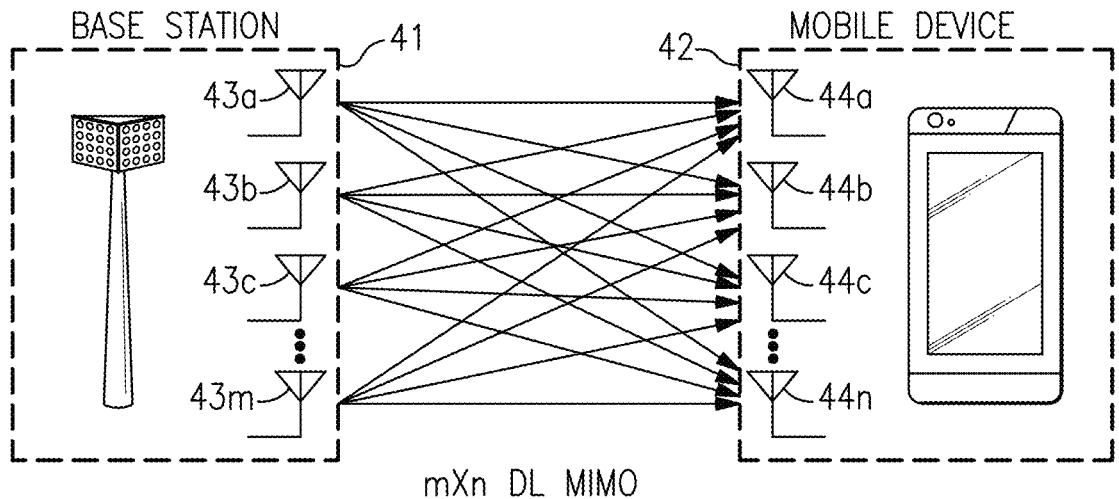
FIG. 3A is a schematic diagram of one example of a downlink channel using multi-input and multi-output (MIMO) communications.
Figure 3B:
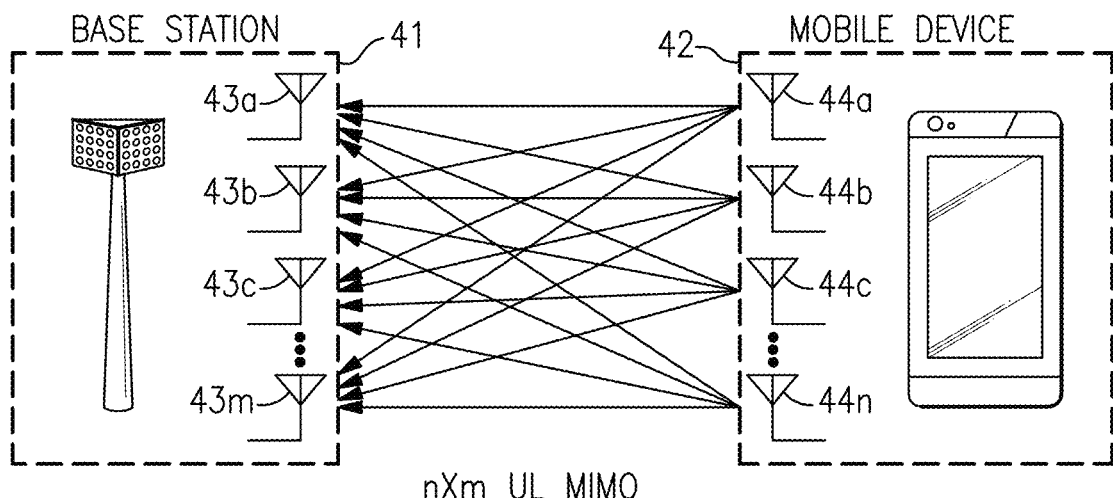
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
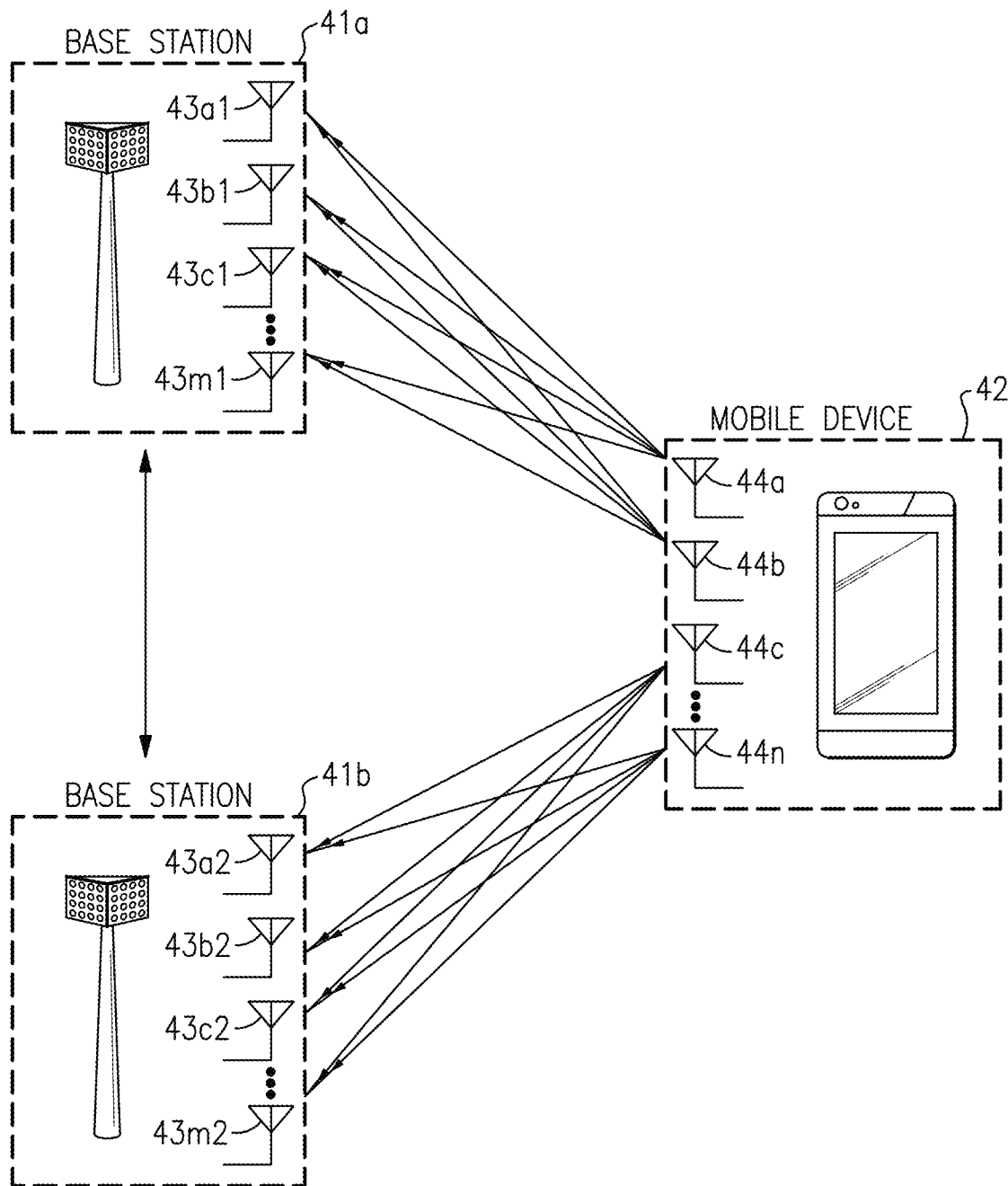
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4:
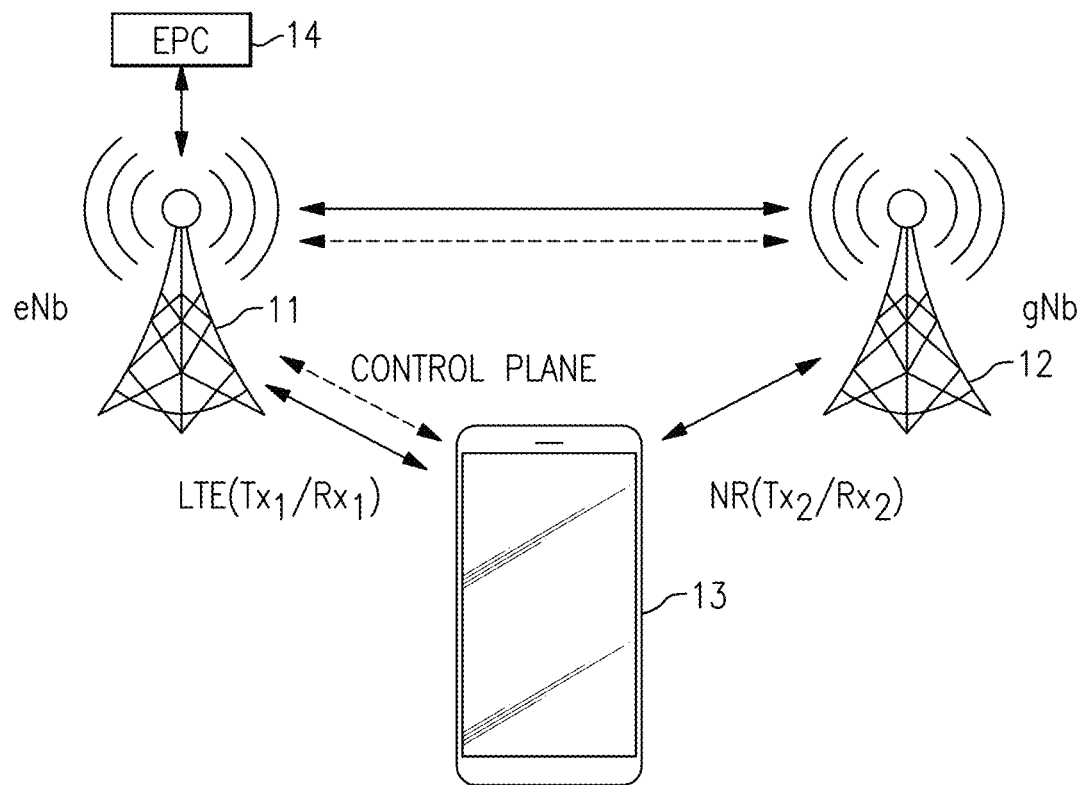
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 13 can simultaneously transmit dual uplink LTE and NR carriers. The UE 13 can transmit an uplink LTE carrier $Tx_1$ to the eNB 11 while transmitting an uplink NR carrier $Tx_2$ to the gNB 12 to implement dual connectivity. Any suitable combination of uplink carriers $Tx_1$, $Tx_2$ and/or downlink carriers $Rx_1$, $Rx_2$ can be concurrently transmitted via wireless links in the example network topology. The eNB 11 can provide a connection with a core network, such as an Evolved Packet Core (EPC) 14. The gNB 12 can communicate with the core network via the eNB 11. Control plane data can be wireless communicated between the UE 13 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 13. With a TDD LTE anchor point, network operation may be synchronous, in which case the operating modes can be constrained to $Tx_1/Tx_2$ and $Rx_1/Rx_2$, or asynchronous which can involve $Tx_1/Tx_2$, $Tx_1/Rx_2$, $Rx_1/Tx_2$, $Rx_1/Rx_2$. When the LTE anchor is a frequency division duplex (FDD) carrier, the TDD/FDD inter-band operation can involve simultaneous $Tx_1/Rx_1/Tx_2$ and $Tx_1/Rx_1/Rx_2$.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Power Amplifier Supply Networks with Harmonic Terminations

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently is such a phone.

To provide such feature support, an RFFE system can be implemented to support EN-DC.

Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB-LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal-to-noise ratio, improved coding, and/or reduced signal interference due to spatial multiplexing differences of the radio environment. MIMO order refers to a number of separate data streams sent or received.

Aforementioned multi-transmitter modes of operation combined with increasing number of power amplifiers in a UE has resulted in power management units (PMUs) being shared for two or more power amplifiers, which may transmit at different times or concurrently.

The power supply networks herein are used to distribute a power amplifier supply voltage from a power management unit to two or more power amplifiers. The power supply network impedance versus frequency is directly related to achieving power amplifiers with high performance, for instance, high power added efficiency (PAE) and/or excellent adjacent channel leakage ratio (ACLR).

As disclosed herein, a power supply network for two or more power amplifiers includes a harmonic termination circuit for each power amplifier. By implementing the power supply network in this manner, excellent PAE, ACLR, and/or other performance parameters are achieved. Moreover, the power supply network can be implemented to provide low impedance at envelope frequencies of the RF signals amplified by the power amplifiers to reduce memory effects and/or support wideband modulation with little to no distortion.

The power supply network can be suitable for powering a wide range of power amplifiers including, but not limited to, inverse class-F power amplifiers. A power supply network for two or more power amplifiers is also referred to herein as a power amplifier system supply network or more simply as a power amplifier supply network.

In certain implementations, a decoupling capacitor is included (for instance, near a supply input pin of a power amplifier module that receives a power amplifier supply voltage from a PMU), and individual inductors are provided along each branch between the decoupling capacitor and a corresponding power amplifier.

The decoupling capacitor can serve to block the effect of trace beyond the power amplifier module (for instance, phone board trace between the power amplifier module and the PMU). Moreover, the decoupling capacitor can be implemented with a large capacitance value but with a low self-resonant frequency due to parasitic inductance (for instance, to represent a small inductor at frequencies higher than its self-resonant frequency due to package parasitics).

The branch-out inductors are used to provide high isolation among collectors or drains of voltage supply nodes to the power amplifiers. Thus, the branch-out inductors provide a choking function. Furthermore, the inductance values can be chosen to achieve desired PA-to-PA isolation and/or PAE due to DC resistance of the branch.

Figure 5:
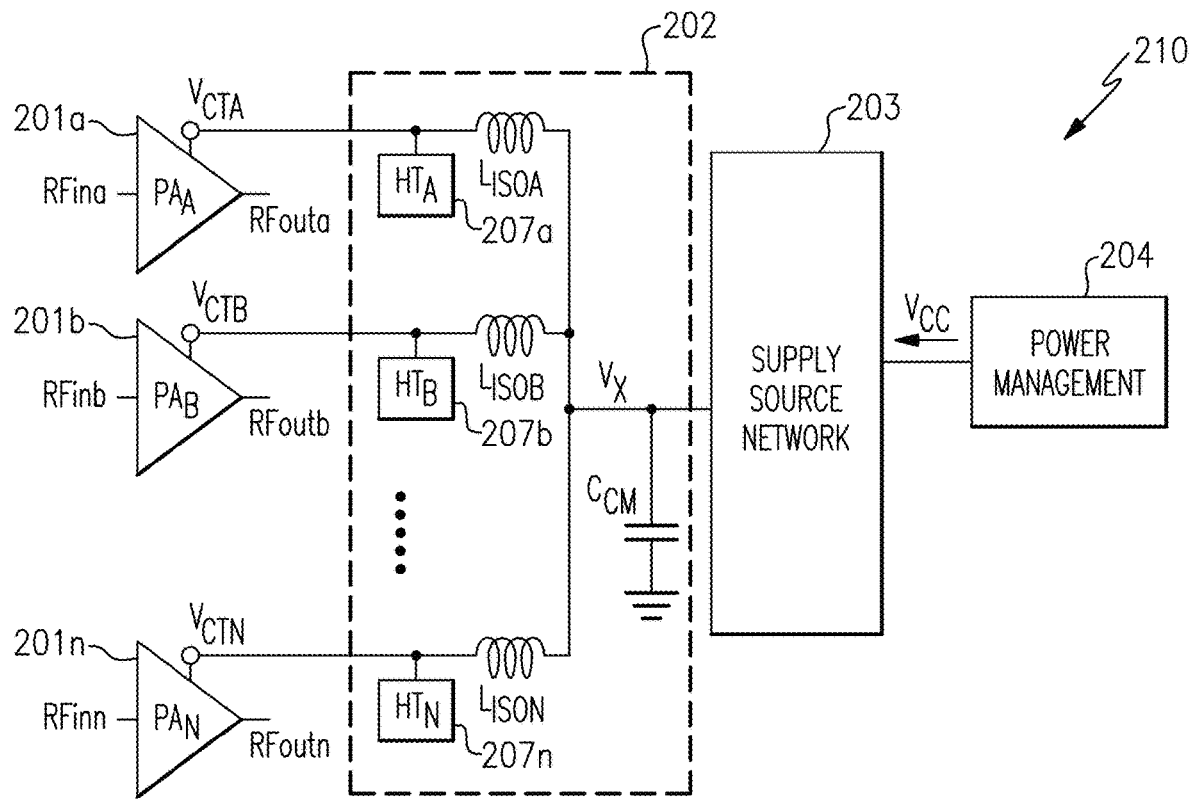
FIG. 5 is a schematic diagram of a power amplifier system according to one embodiment.

FIG. 5 is a schematic diagram of a power amplifier system 210 according to one embodiment. The power amplifier system 210 includes power amplifiers 201a, 201b, . . . , 201n, a power amplifier supply network 202, a supply source network 203, and a PMU 204.

In the illustrated embodiment, the power amplifier system 210 includes an integer n number of power amplifiers, where n is greater than or equal to 2. Thus, although three power amplifiers and corresponding components are shown, the power amplifier system 210 can include a different number of power amplifiers.

As shown in FIG. 5, each power amplifier amplifies a different RF input signal to generate an RF output signal. For example, the power amplifier 201a amplifies an RF input signal RFina to generate an RF output signal RFouta. Additionally, the power amplifier 201b amplifies the RF input signal RFinb to generate the RF output signal RFoutb, and the power amplifier 201n amplifies the RF input signal RFinn to generate the RF output signal RFoutn. In certain implementations, each of the RF input signals has a different fundamental frequency.

In the illustrated embodiment, the power amplifier supply network 202 receives a power amplifier supply voltage $V_{CC}$ from the PMU 204 by way of the supply source network 203. In certain implementations, the power amplifier supply network 202 and the power amplifiers 201a, 201b, . . . 201n are part of a power amplifier module, on a phone board and the supply source network 203 represents phone board trace used to route the power amplifier supply voltage $V_{CC}$ from the PMU 204 to a supply input pin of the power amplifier module.

As shown in FIG. 5, the power amplifier supply network 202 includes a common mode decoupling capacitor $C_{CM}$, which can be connected between the network's power supply input node $V_X$ and ground. The power amplifier supply network 202 further includes power supply distribution nodes $V_{CTA}$, $V_{CTB}$, . . . $V_{CTN}$ for providing the power amplifier supply voltage $V_{CC}$ to supply inputs of the power amplifiers 201a, 201b, . . . 201n, respectively.

The power amplifier supply network 202 includes a plurality of branches for connecting between the power supply input node $V_X$ and the power supply distribution nodes $V_{CTA}$, $V_{CTB}$, . . . $V_{CTN}$. Each branch includes an isolation inductor (also referred to herein as a branch-out inductor) and a harmonic termination circuit. In particular, isolation inductors $L_{ISOA}$, $L_{ISOB}$, . . . $L_{ISON}$ are provided in series along the branches and the harmonic termination circuits 207a, 207b, . . . 207n are provided in shunt to the branches.

In certain implementations, the harmonic termination circuits 207a, 207b, . . . 207n are connected between the respective branches and ground.

Figure 6:
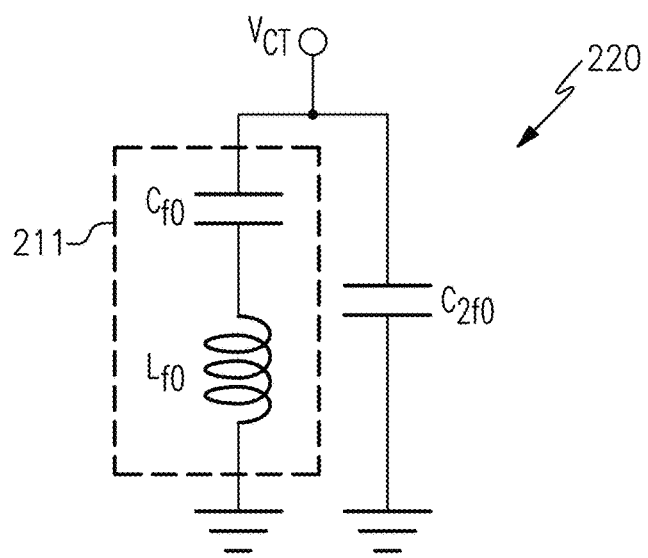
FIG. 6 is a schematic diagram of one embodiment of a harmonic termination circuit for a power amplifier supply network.

FIG. 6 is a schematic diagram of one embodiment of a harmonic termination circuit 220 for a power amplifier supply network. The harmonic termination circuit 220 represents one embodiment of one of the harmonic termination circuits 207a, 207b, . . . 207n of FIG. 5.

In the illustrated embodiment, the harmonic termination circuit 220 is connected between a power supply distribution node $W_{CT}$ and a ground voltage (ground), and includes a fundamental tank circuit 211 and a second harmonic termination capacitor $C_{2f0}$. The fundamental tank circuit 211 includes a capacitor $C_{f0}$ and an inductor $L_{f0}$ in series and operable to provide a short (or short circuit, for example, an impedance of less than 1Ω) about at the fundamental frequency (for example, within 10% of the fundamental frequency) of the RF signal amplified by the associated power amplifier. Additionally, the second harmonic termination capacitor $C_{2f0}$ with the fundamental tank circuit 211 provides an open (or open circuit, for example, an impedance of at least 10 kΩ) about at twice the fundamental frequency (for example, within 10% of twice the fundamental frequency). In certain implementations, the harmonic termination circuit 220 further provides low impedance at a third harmonic frequency (about at three times the fundamental frequency, for example, within 10% of three times the fundamental frequency).

Figure 7A:
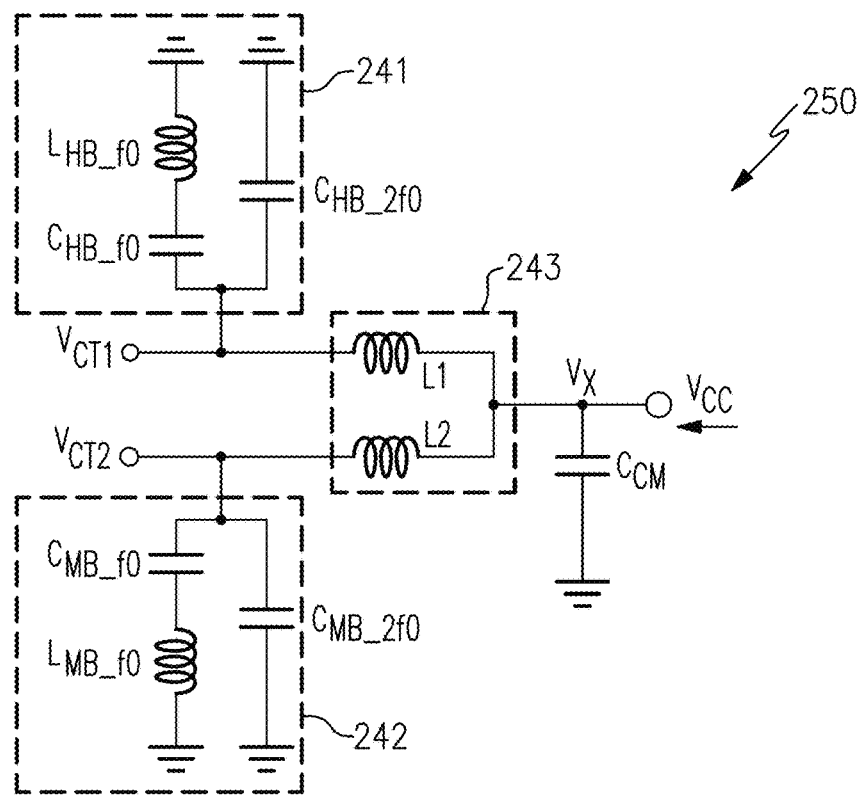
FIG. 7A is a schematic diagram of a power amplifier supply network according to another embodiment.

FIG. 7A is a schematic diagram of a power amplifier supply network 250 according to another embodiment. The power amplifier supply network 250 include a power supply input node $V_X$ for receiving a power amplifier supply voltage $V_{CC}$ from a PMU (for instance, a power management integrated circuit or PMIC including one or more switching regulators), a first power supply distribution node $V_{CT1}$ for providing the power amplifier supply voltage $V_{CC}$ to a HB power amplifier (amplifying a first RF signal in the HB frequency range), and a second power supply distribution node $V_{CT2}$ for providing the power amplifier supply voltage $V_{CC}$ to a MB power amplifier (amplifying a second RF signal in the MB frequency range).

With continuing reference to FIG. 7A, the power amplifier supply network 250 further includes a common mode decoupling capacitor $C_{CM}$, a HB harmonic termination circuit 241, a MB harmonic termination circuit 242, and branch-out inductors 243.

The HB harmonic termination circuit 241 includes a second harmonic capacitor $C_{HB\_2f0}$ in parallel with a HB fundamental tank circuit that includes a capacitor $C_{HB\_f0}$ and an inductor $L_{HB\_2f0}$ in series. Additionally, the MB harmonic termination circuit 242 includes a second harmonic capacitor $C_{MB\_2f0}$ in parallel with an MB fundamental tank circuit that includes a capacitor $C_{MB\_f0}$ and an inductor $L_{MB\_f0}$ in series. Furthermore, the branch-out inductors 243 include a first inductor L1 for the branch to the first power supply distribution node $V_{CT1}$, and a second inductor L2 for the branch to the second power supply distribution node $V_{CT2}$.

Figure 7B:
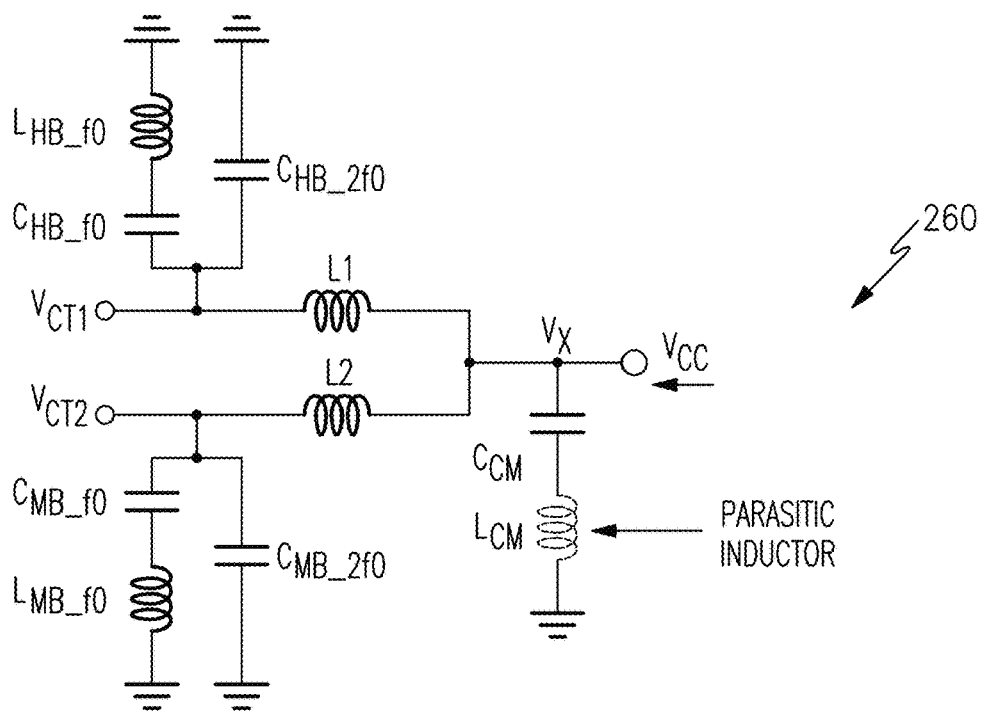
FIG. 7B is a schematic diagram of a power amplifier supply network according to another embodiment.

FIG. 7B is a schematic diagram of a power amplifier supply network 260 according to another embodiment. The power amplifier supply network 260 of FIG. 7B is similar to the power amplifier supply network 250 of FIG. 7A, except that the power amplifier supply network 260 further includes a parasitic inductor $L_{CM}$ in series with the common mode decoupling capacitor $C_{CM}$ and representing a parasitic inductance present in a typical physical implementation.

Figure 8A:
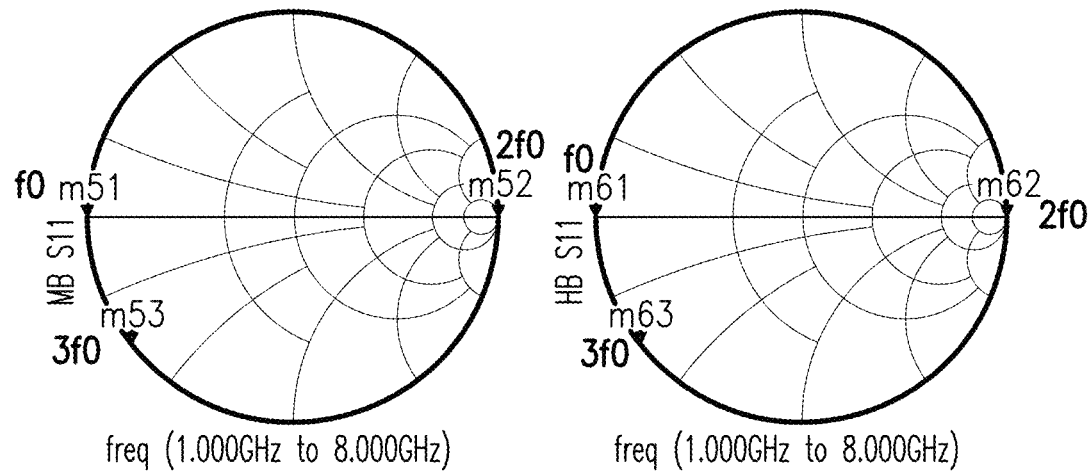
FIG. 8A depicts one example of Smith charts of mid band reflection coefficient (MB S11) and high band reflection coefficient (HB S11) for a power amplifier system supply network.

FIG. 8A depicts one example of Smith charts of mid band reflection coefficient (MB S11) and high band reflection coefficient (HB S11) for a power amplifier system supply network corresponding to one implementation of the power amplifier supply network 250 of FIG. 7A. The Smith charts include circular trajectories representing frequency sweeps from 1 GHz to 8 GHz. In the example of FIG. 8A, the components are represented as ideal, and measurements for the fundamental (shorted), the second harmonic (open), and the third harmonic (low impedance) are shown.

Figure 8B:
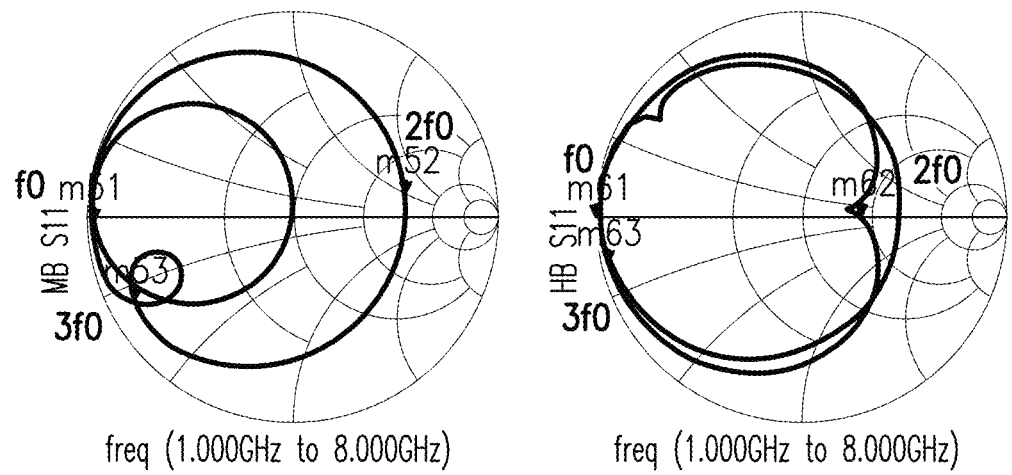
FIG. 8B depicts another example of Smith charts of MB S11 and HB S11 for a power amplifier system supply network.

FIG. 8B depicts another example of Smith charts of MB S11 and HB S11 for a power amplifier system supply network. The Smith charts are taken from a simulation similar to that of FIG. 8A, but for which modeling of parasitics is also included.

Figure 9A:
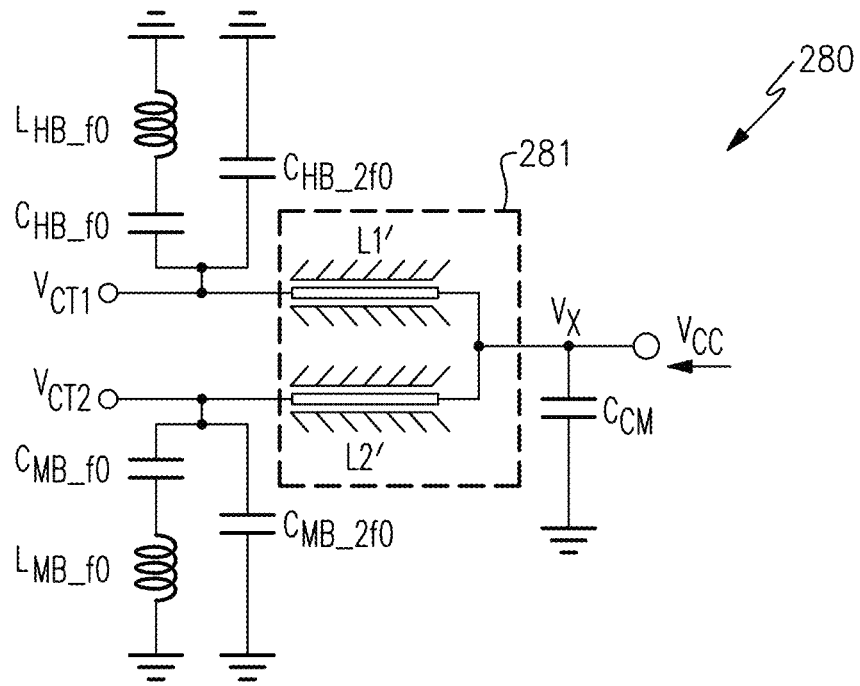
FIG. 9A is a schematic diagram of a power amplifier system supply network according to another embodiment.

FIG. 9A is a schematic diagram of a power amplifier supply network 280 according to another embodiment. The power amplifier supply network 280 of FIG. 9A is similar to the power amplifier supply network 250 of FIG. 7A, except that the power amplifier supply network 280 of FIG. 9A includes branching inductors 281 implemented as inductive transmission lines L1' and L2'.

Figure 9B:
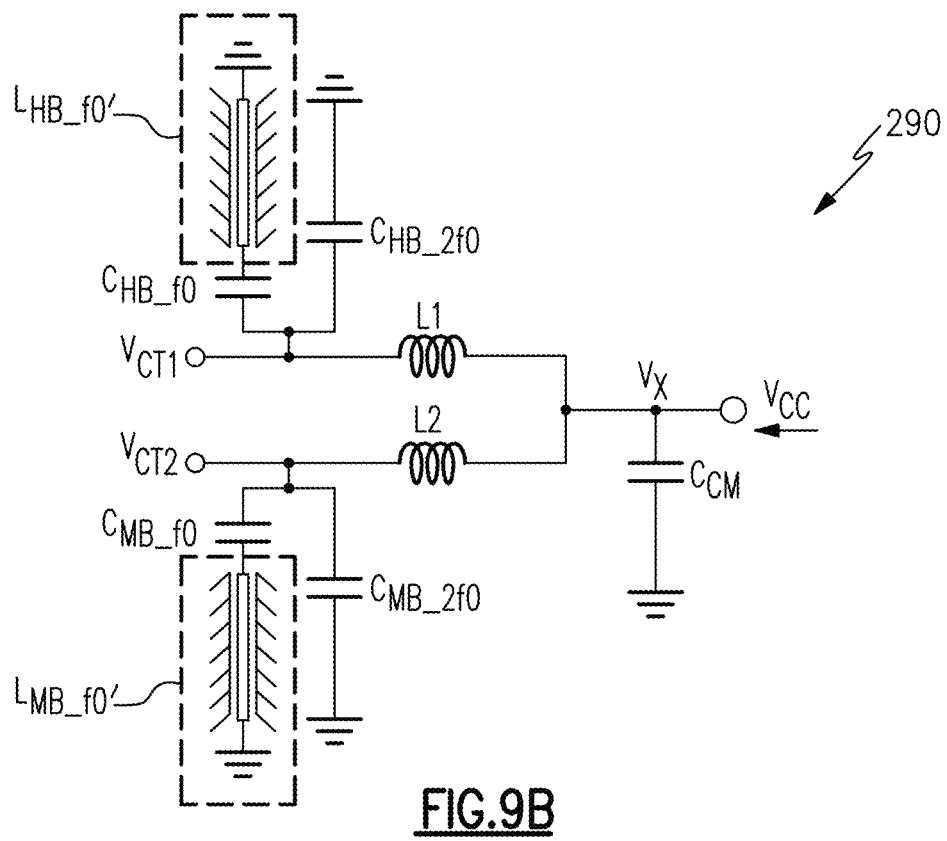
FIG. 9B is a schematic diagram of a power amplifier supply system network according to another embodiment.

FIG. 9B is a schematic diagram of a power amplifier supply network 290 according to another embodiment. The power amplifier supply network 290 of FIG. 9A is similar to the power amplifier supply network 250 of FIG. 7A, except that the power amplifier supply network 290 of FIG. 9A includes fundamental tank circuit inductors implemented as inductive transmission lines $L_{HB\_f0'}$ and $L_{MB\_f0''}$.

Figure 10A:
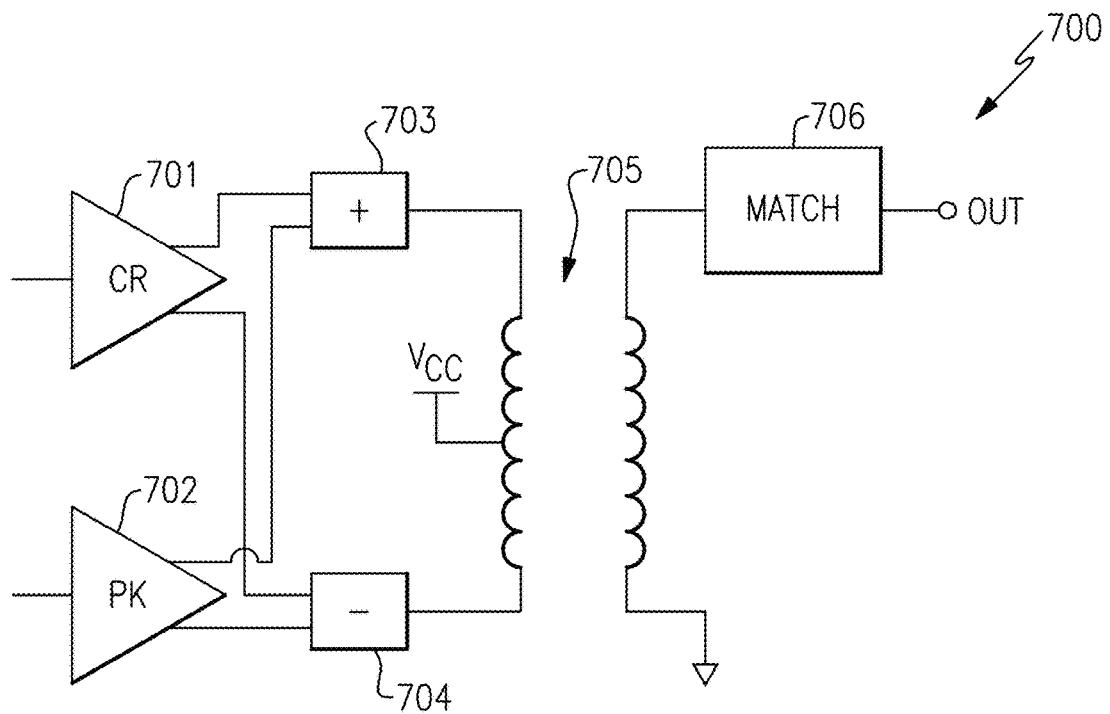
FIG. 10A is a schematic diagram of a power amplifier according to one embodiment.

FIG. 10A is a schematic diagram of a power amplifier 700 according to one embodiment. The power amplifier 700 is implemented as a Doherty power amplifier including a carrier amplifier 701, a peaking amplifier 702, a first combining circuit 703, a second combining circuit 704, an output balun 705, and a matching circuit 706.

As shown in FIG. 10A, the first combining circuit 703 combines quadrature-phase signal (90 degree) components from the carrier amplifier 701 and the peaking amplifier 702 to generate a first combined signal. Additionally, the second combining circuit 704 combines quadrature-phase signal (-90 degree) components from the carrier amplifier 701 and the peaking amplifier 702 to generate a second combined signal. The first combined signal and the second combined signal drive opposite ends of a first winding of the output balun 705, while an output signal OUT is generated from a second winding of the output balun 705 that is matched using the matching circuit 706, in this implementation. However, other implementations are possible, such as configurations in which the matching circuit 706 is omitted or arranged in other ways.

As shown in FIG. 10A, a power amplifier supply voltage $V_{CC}$ is provided from a power amplifier supply network to a center tap of the first winding of the output balun 705.

In certain power amplifier implementations, such as the power amplifier 700 of FIG. 10A, including harmonic terminations in the power amplifier supply network that delivers the power amplifier supply voltage $V_{CC}$ can aid in improving and/or achieving desired output matching characteristics.

Although one embodiment of a power amplifier is shown, the power amplifier supply networks herein can be used to distribute power to power amplifiers implemented in a wide variety of ways. Examples of suitable power amplifier topologies include, but are not limited to, cascode field-effect transistor (FET) power amplifiers, common-source power amplifiers, cascode bipolar power amplifiers, common-emitter power amplifiers, and/or Doherty power amplifiers.

Figure 10B:
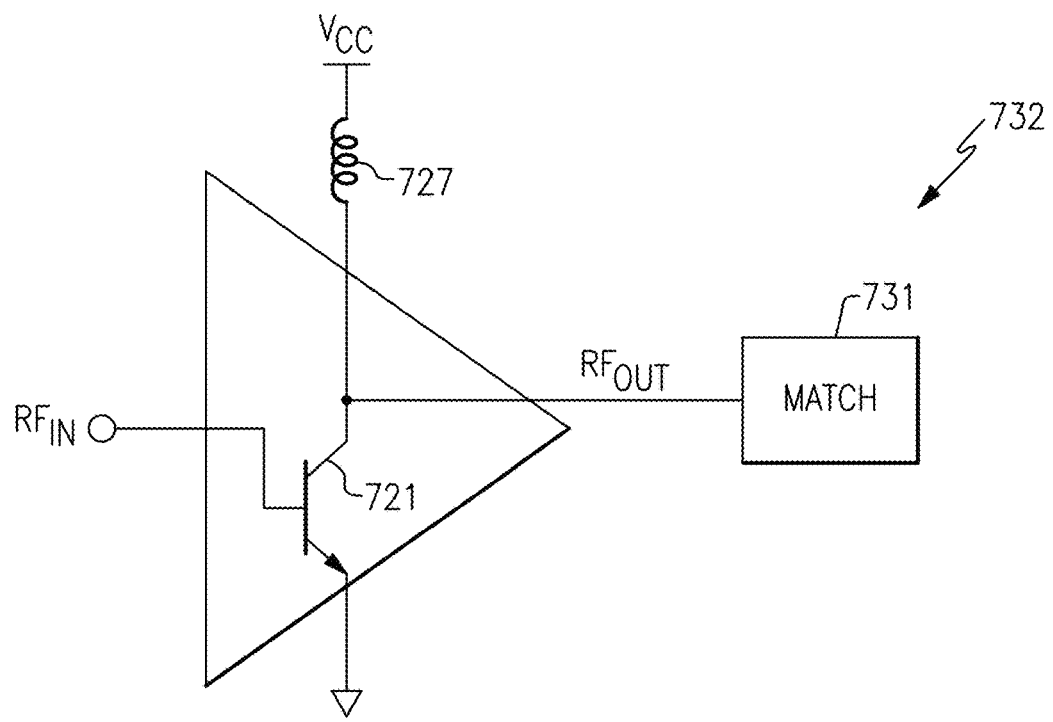
FIG. 10B is a schematic diagram of a power amplifier according to another embodiment.

FIG. 10B is a schematic diagram of a power amplifier 732 according to another embodiment. The power amplifier 732 receives a power amplifier supply voltage $V_{CC}$ from a power amplifier supply network. Additionally, an inductor 727 is used to provide the power amplifier supply voltage $V_{CC}$ to a collector of a bipolar transistor 729. The collector of the bipolar transistor 720 is terminated using an output impedance matching circuit 731.

As shown in FIG. 10B, the emitter of the bipolar transistor 729 is electrically connected to ground, and an RF signal ($RF_{IN}$) is provided to the base of the bipolar transistor 729. The bipolar transistor 729 amplifies the RF signal to generate an amplified RF signal at the collector. The bipolar transistor 729 can be any suitable device. In one implementation, the bipolar transistor 729 is a heterojunction bipolar transistor (HBT).

The output impedance matching circuit 731 serves to terminate the output of the power amplifier 732, which can aid in increasing power transfer and/or reducing reflections of the amplified RF signal generated by the power amplifier 732. In certain implementations, the output impedance matching circuit 731 further operates to provide harmonic termination and/or to control a load line impedance of the power amplifier 732.

The inductor 727 can be included to provide the power amplifier 732 with the power amplifier supply voltage $V_{CC}$ received from the power amplifier supply network while choking or blocking high frequency RF signal components. In certain implementations, the inductor 727 operates in combination with the impedance matching circuit 731 to provide output matching.

Although FIG. 10B illustrates one implementation of the power amplifier 732, skilled artisans will appreciate that the teachings described herein can be applied to a variety of power amplifier structures, such as multi-stage power amplifiers and power amplifiers employing other transistor structures. For example, in some implementations the bipolar transistor 729 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 732 can be adapted to include additional circuitry, such as biasing circuitry.

Figure 11:
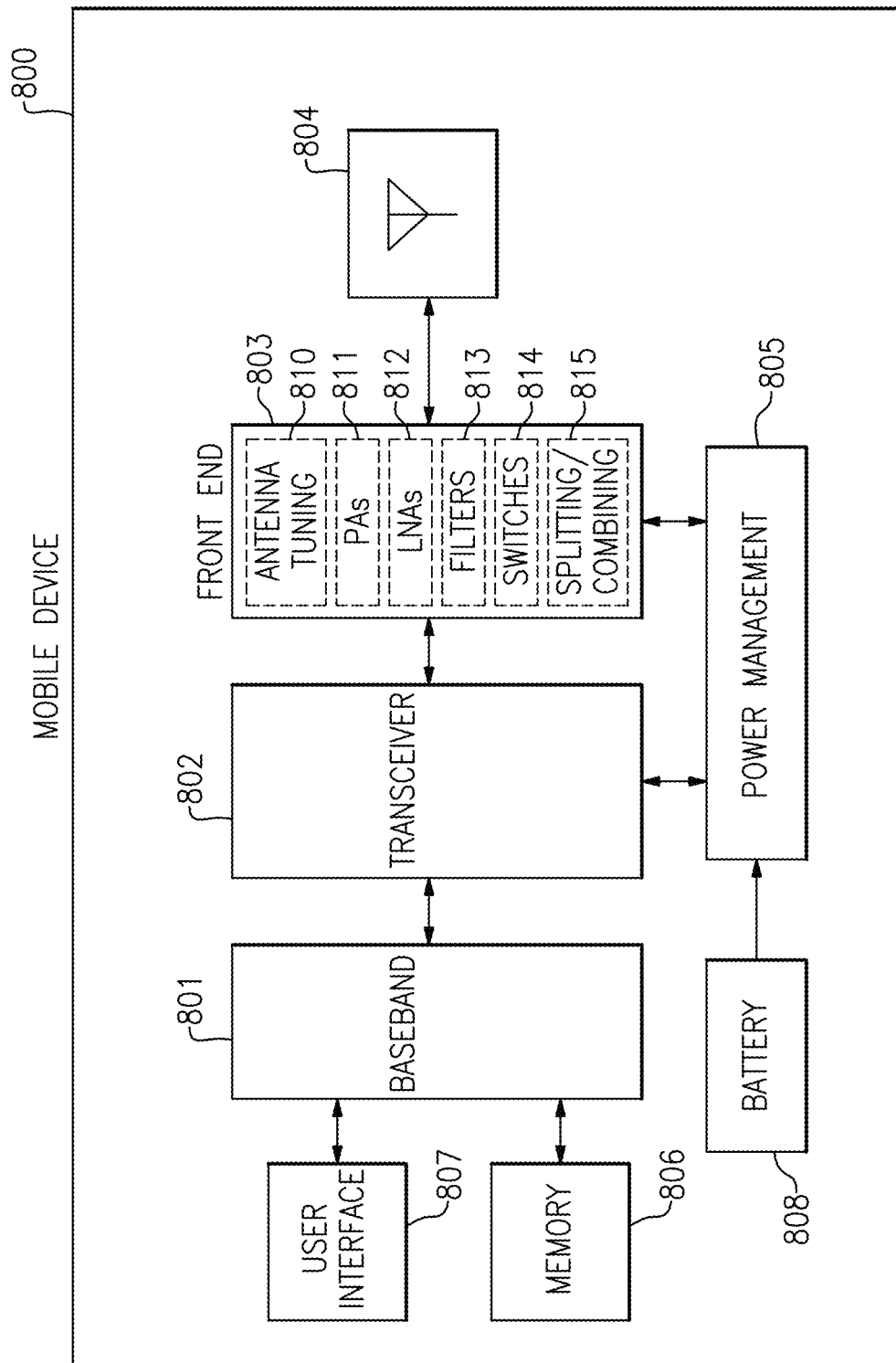
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE). The power management system 805 can include PMUs implemented in accordance with the teachings herein. Thus, the power management system 805 can be implemented in accordance with any of the embodiments herein, and serves as a power management sub-system for UE.

As shown in FIG. 11, the power management system 805 receives a battery voltage from the battery 808. The battery 808 can be any suitable battery for use in the mobile device 800, including, for example, a lithium-ion battery.

Figure 12:
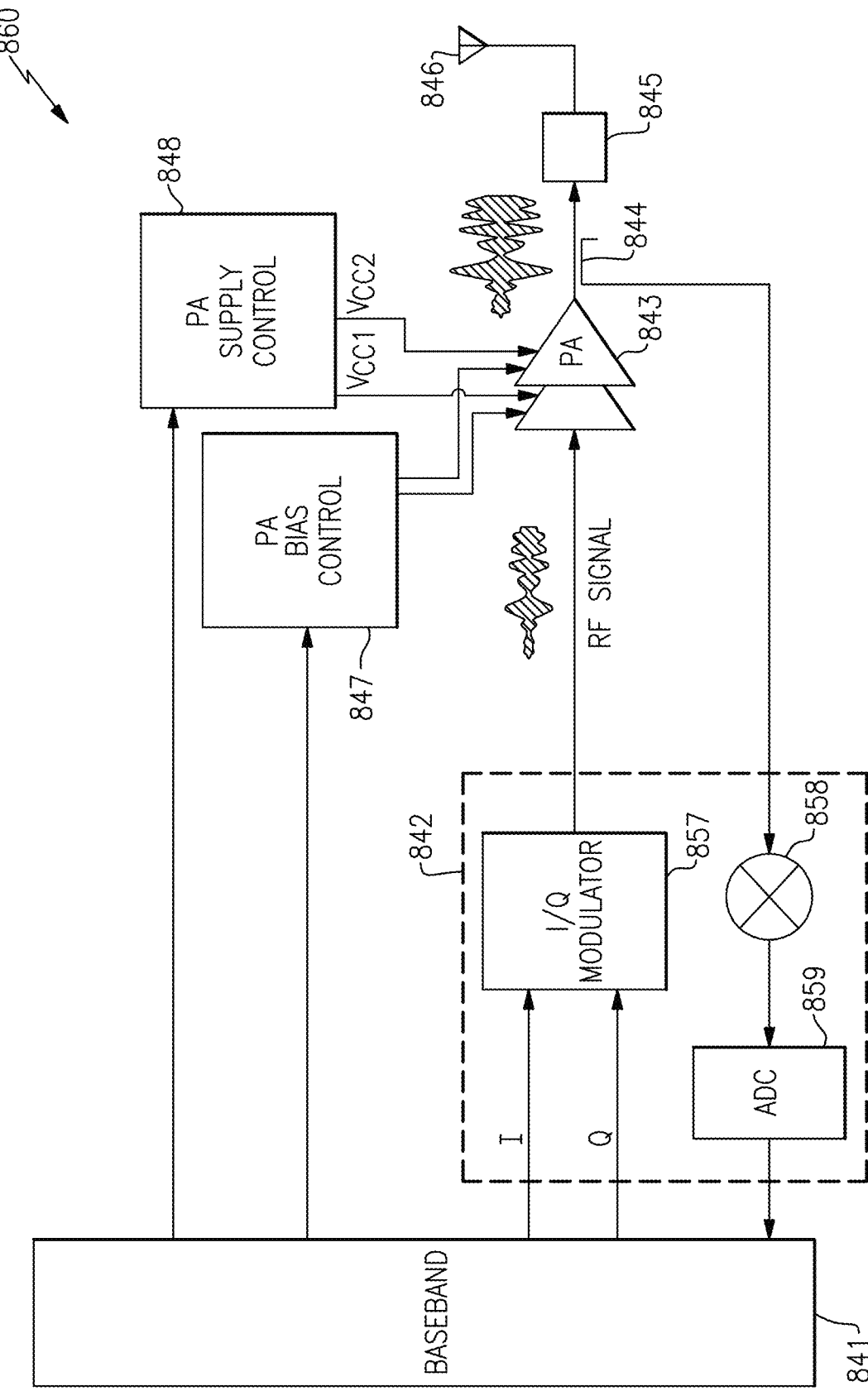
FIG. 12 is a schematic diagram of a power amplifier system according to one embodiment.

FIG. 12 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 12, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 13A:
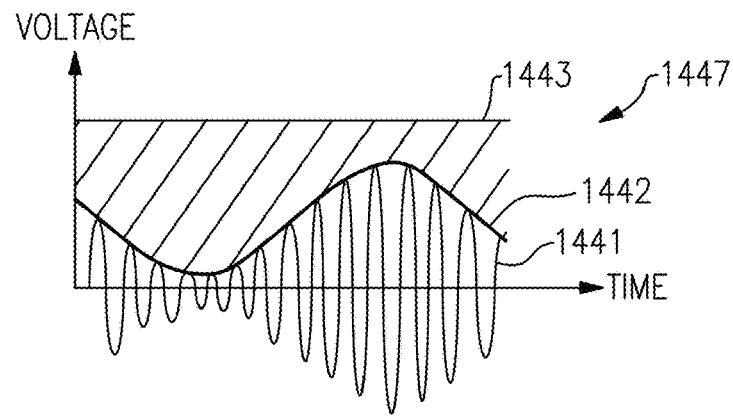
FIG. 13A is a graph showing a first example of power amplifier supply voltage versus time.

FIG. 13A is a graph 1447 showing a first example of power amplifier supply voltage versus time. The graph 1447 illustrates the voltage of an RF signal 1441, the RF signal's envelope 1442, and a power amplifier supply voltage 1443 versus time. The graph 1447 corresponds to one example of waveforms for an implementation in which the power amplifier supply voltage 1443 is substantially fixed (DC).

It can be important that the power amplifier supply voltage 1443 of a power amplifier has a voltage greater than that of the RF signal 1441. For example, powering a power amplifier using a power amplifier supply voltage that has a magnitude less than that of the RF signal can clip the RF signal, thereby creating signal distortion and/or other problems. Thus, it can be important the power amplifier supply voltage 1443 be greater than that of the envelope 1442. However, it can be desirable to reduce a difference in voltage between the power amplifier supply voltage 1443 and the envelope 1442 of the RF signal 1441, as the area between the power amplifier supply voltage 1443 and the envelope 1442 can represent lost energy, which can reduce battery life and increase heat generated in a wireless device.

Figure 13B:
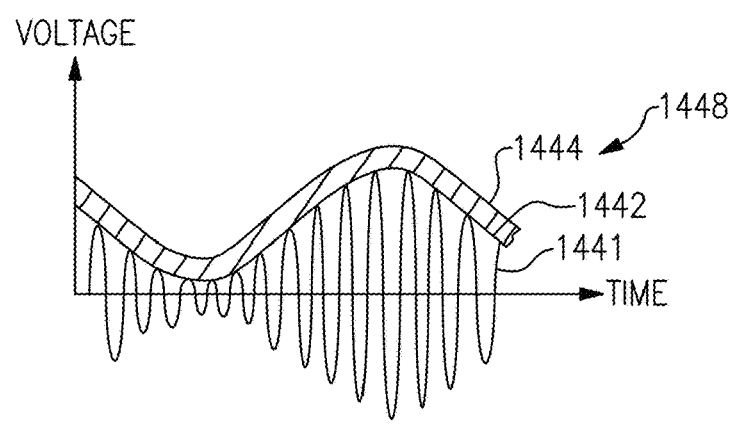
FIG. 13B is a graph showing a second example of power amplifier supply voltage versus time.

FIG. 13B is a graph 1448 showing a second example of power amplifier supply voltage versus time. The graph 1448 illustrates the voltage of an RF signal 1441, the RF signal's envelope 1442, and a power amplifier supply voltage 1444 versus time. The graph 48 corresponds to one example of waveforms for an implementation in which the power amplifier supply voltage 1444 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 1443 of FIG. 13A, the power amplifier supply voltage 1444 of FIG. 13B changes in relation to the envelope 1442 of the RF signal 1441. The area between the power amplifier supply voltage 1444 and the envelope 1442 in FIG. 13B is less than the area between the power amplifier supply voltage 1443 and the envelope 1442 in FIG. 13A, and thus the graph 1448 of FIG. 13B can be associated with a power amplifier system having greater energy efficiency.

Figure 13C:
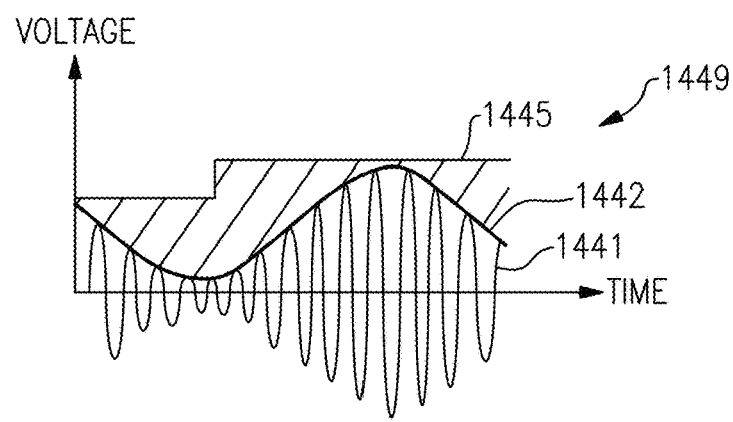
FIG. 13C is a graph showing a third example of power amplifier supply voltage versus time.

FIG. 13C is a graph 1449 showing a third example of power amplifier supply voltage versus time. The graph 1449 illustrates the voltage of an RF signal 1441, the RF signal's envelope 1442, and a power amplifier supply voltage 1445 versus time. The graph 1449 corresponds to one example of waveforms for an implementation in which the power amplifier supply voltage 1445 is generated by average power tracking (APT).

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot, but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

APPLICATIONS

Some of the embodiments described above have provided examples in connection with mobile devices. However, the principles and advantages of the embodiments can be used for any other systems or apparatus that have needs for power amplifier supply network architectures. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a first radio frequency signal of a first fundamental frequency and a second radio frequency signal of a second fundamental frequency; and
a front-end system including a first power amplifier configured to amplify the first radio frequency signal and a second power amplifier configured to amplify the second radio frequency signal, and a power amplifier supply network configured to receive a power amplifier supply voltage at an input node, and to provide the power amplifier supply voltage to the first power amplifier at a first distribution node and to the second power amplifier at a second distribution node, the power amplifier supply network including a first harmonic termination circuit connected to the first distribution node and configured to provide an open circuit at about twice the first fundamental frequency, and a second harmonic termination circuit connected to the second distribution node and configured to provide an open circuit at about twice the second fundamental frequency.

2. The mobile phone of claim 1 wherein the first harmonic termination circuit is further configured to provide a short circuit at about the first fundamental frequency, and the second harmonic termination circuit is further configured to provide a short circuit at about the second fundamental frequency.

3. The mobile phone of claim 2 wherein the first harmonic termination circuit is further configured to provide a low impedance at about three times the first fundamental frequency, and the second harmonic termination circuit is further configured to provide a low impedance at about three times the second fundamental frequency.

4. The mobile phone of claim 2 wherein the first harmonic termination circuit includes a first capacitor connected between the first distribution node and a ground voltage, and a first tank circuit in parallel with the first capacitor and including a first tank inductor in series with a first tank capacitor.

5. The mobile phone of claim 1 wherein the first fundamental frequency is in a high band and the second fundamental frequency is in a mid band.

6. The mobile phone of claim 1 wherein the power amplifier supply network further includes a first isolation inductor connected between the input node and the first distribution node, and a second isolation inductor connected between the input node and the second distribution node.

7. The mobile phone of claim 6 wherein the power amplifier supply network further includes a common mode capacitor connected between the input node and a ground voltage.

8. The mobile phone of claim 1 wherein the first power amplifier includes an output balun, and the first distribution node is connected to a center tap of a first winding of the output balun.

9. The mobile phone of claim 1 further comprising a power management unit configured to generate the power amplifier supply voltage.

10. The mobile phone of claim 1 wherein the front end system further includes a third power amplifier configured to amplify a third radio frequency signal and to receive the power amplifier supply voltage from a third distribution node of the power amplifier supply network, the power amplifier supply network further including a third harmonic termination circuit connected to the third distribution node and configured to provide an open circuit at about twice a third fundamental frequency of the third radio frequency signal.

11. A power amplifier system comprising:
a first power amplifier configured to amplify a first radio frequency signal of a first fundamental frequency;
a second power amplifier configured to amplify a second radio frequency signal of a second fundamental frequency; and
a power amplifier supply network configured to receive a power amplifier supply voltage at an input node, and to provide the power amplifier supply voltage to the first power amplifier at a first distribution node and to the second power amplifier at a second distribution node, the power amplifier supply network including a first harmonic termination circuit connected to the first distribution node and configured to provide an open circuit at about twice the first fundamental frequency, and a second harmonic termination circuit connected to the second distribution node and configured to provide an open circuit at about twice the second fundamental frequency.

12. The power amplifier system of claim 11 wherein the first harmonic termination circuit is further configured to provide a short circuit at about the first fundamental frequency, and the second harmonic termination circuit is further configured to provide a short circuit at about the second fundamental frequency.

13. The power amplifier system of claim 12 wherein the first harmonic termination circuit is further configured to provide a low impedance at about three times the first fundamental frequency, and the second harmonic termination circuit is further configured to provide a low impedance at about three times the second fundamental frequency.

14. The power amplifier system of claim 12 wherein the first harmonic termination circuit includes a first capacitor connected between the first distribution node and a ground voltage, and a first tank circuit in parallel with the first capacitor and including a first tank inductor in series with a first tank capacitor.

15. The power amplifier system of claim 11 wherein the first fundamental frequency is in a high band and the second fundamental frequency is in a mid band.

16. The power amplifier system of claim 11 wherein the power amplifier supply network further includes a first isolation inductor connected between the input node and the first distribution node, and a second isolation inductor connected between the input node and the second distribution node.

17. The power amplifier system of claim 16 wherein the power amplifier supply network further includes a common mode capacitor connected between the input node and a ground voltage.

18. The power amplifier system of claim 11 wherein the first power amplifier includes an output balun, and the first distribution node is connected to a center tap of a first winding of the output balun.

19. The power amplifier system of claim 11 further comprising a third power amplifier configured to amplify a third radio frequency signal and to receive the power amplifier supply voltage from a third distribution node of the power amplifier supply network, the power amplifier supply network further including a third harmonic termination circuit connected to the third distribution node and configured to provide an open circuit at about twice a third fundamental frequency of the third radio frequency signal.

20. A method of power supply distribution in a mobile device, the method comprising:
- amplifying a first radio frequency signal of a first fundamental frequency using a first power amplifier;
- amplifying a second radio frequency signal of a second fundamental frequency using a second power amplifier;
- distributing a power amplifier supply voltage received at an input node of a power amplifier supply network to the first power amplifier at a first distribution node and to the second power amplifier at a second distribution node;
- providing an open circuit at about twice the first fundamental frequency using a first harmonic termination circuit connected to the first distribution node; and
- providing an open circuit at about twice the second fundamental frequency using a second harmonic termination circuit connected to the second distribution node.

* * * * *